United States Patent
Sun

(10) Patent No.: US 9,059,215 B2
(45) Date of Patent: Jun. 16, 2015

(54) METHOD FOR ADJUSTING THE THRESHOLD VOLTAGE OF LTPS TFT

(71) Applicant: EverDisplay Optronics (Shanghai) Limited, Shanghai (CN)

(72) Inventor: Lunan Sun, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 14/229,337

(22) Filed: Mar. 28, 2014

(65) Prior Publication Data

US 2014/0295627 A1    Oct. 2, 2014

(30) Foreign Application Priority Data

Mar. 29, 2013    (CN) .......................... 2013 1 0109382

(51) Int. Cl.
*H01L 29/66* (2006.01)
*H01L 27/12* (2006.01)
*H01L 29/786* (2006.01)

(52) U.S. Cl.
CPC ...... *H01L 29/66757* (2013.01); *H01L 27/1214* (2013.01); *H01L 29/66492* (2013.01); *H01L 29/786* (2013.01)

(58) Field of Classification Search
None
See application file for complete search history.

(56) References Cited

U.S. PATENT DOCUMENTS

| | | | | |
|---|---|---|---|---|
| 5,292,675 | A * | 3/1994 | Codama | 438/163 |
| 7,238,600 | B2 * | 7/2007 | Yamazaki et al. | 438/163 |
| 7,705,358 | B2 * | 4/2010 | Okamoto et al. | 257/72 |
| 7,884,369 | B2 * | 2/2011 | Yamazaki et al. | 257/72 |
| 7,897,445 | B2 * | 3/2011 | Chang et al. | 438/163 |
| 7,964,873 | B2 * | 6/2011 | You | 257/69 |
| 8,921,169 | B2 * | 12/2014 | Yamazaki et al. | 438/164 |
| 2002/0025591 | A1 * | 2/2002 | Ohnuma et al. | 438/30 |
| 2002/0104992 | A1 * | 8/2002 | Tanabe et al. | 257/48 |
| 2002/0110941 | A1 * | 8/2002 | Yamazaki et al. | 438/25 |
| 2002/0119606 | A1 * | 8/2002 | Hamada et al. | 438/149 |
| 2003/0030080 | A1 * | 2/2003 | Dai et al. | 257/288 |
| 2003/0124778 | A1 * | 7/2003 | Doi et al. | 438/151 |
| 2003/0231263 | A1 * | 12/2003 | Kato et al. | 349/56 |

(Continued)

FOREIGN PATENT DOCUMENTS

| | | |
|---|---|---|
| CN | 1560657 A | 1/2005 |
| CN | 101852893 A | 10/2010 |

*Primary Examiner* — Andres Munoz
(74) *Attorney, Agent, or Firm* — Morris Manning & Martin LLP; Tim Tingkang Xia, Esq.

(57) ABSTRACT

The N-type poly-silicon is applied in the LTPS productions. The LTPS productions comprise an N-type poly-silicon and a P-type poly-silicon. The N-type poly-silicon, from bottom to top, successively includes a substrate layer, a $SiO_x$ layer, a $SiN_x$ layer, a metal layer and a photoresist. The substrate layer is an A-type silicon layer. Wherein, the method for controlling the threshold voltage of the N-type poly-silicon specifically comprise the following steps: (a) etching the metal layer and the $SiN_x$ layer, and over etching the $SiO_x$ layer in a small quantity; (b) over etching the metal layer, and etching a portion of the $SiO_x$ layer, and the $SiO_x$ layer is not etched through.

11 Claims, 4 Drawing Sheets

(56) References Cited

U.S. PATENT DOCUMENTS

| | | | |
|---|---|---|---|
| 2005/0101062 A1* | 5/2005 | You | 438/128 |
| 2007/0249182 A1 | 10/2007 | Mani et al. | |
| 2014/0374714 A1* | 12/2014 | Hsu et al. | 257/40 |
| 2014/0374718 A1* | 12/2014 | Hsu et al. | 257/40 |

* cited by examiner

METHOD FOR ADJUSTING THE THRESHOLD VOLTAGE OF LTPS TFT

CROSS-REFERENCE TO RELATED APPLICATIONS

The present application claims priority to and the benefit of Chinese Patent Application No. CN 201310109382.7, filed on Mar. 29, 2013, the entire content of which is incorporated herein by reference.

BACKGROUND OF THE INVENTION

1. Field of the Invention

The present disclosure relates to the technology of low temperature poly-silicon, more specifically, to a method for adjusting the threshold voltage of LTPS TFT.

2. Description of the Related Art

The Low Temperature Poly-silicon ("LTPS", hereinafter) productions require Vth (the threshold voltage or gate voltage) of the P-type device and the N-type device be symmetric with the voltage of 0V. The advantage of it thereof is that the switch effect of the circuit is relatively obvious. The condition of abnormal in switching is not likely to be occurred. However, in the practical productive process, the condition that Vth is small caused by the left avertence of the I-V curve of the N-type device is likely to be occurred, which will further cause the problem that Vth of the P-type device is not symmetric with that of the N-type device.

An LTPS device as shown in FIG. 1A-FIG. 1B, a buffer layer of Nitride 11 ($SiN_x$) and Oxide 12 ($SiO_x$) is formed over Substrate 10. Poly-silicon 13 is formed on the local area of Oxide 12. In the current processes, the etching process generally comprises the following two steps. The first step is etching Metal Layer 16 (M1) and Nitride ($SiN_x$) Layer 15 by dry etching in the Inductively Coupled Plasma mode with $SF_6$ gas and $O_2$ gas and by utilizing a Photoresist 17. Meanwhile, Oxide ($SiO_x$) layer will be over etched in a small amount; as the critical dimension of the device, which is acquired after Metal Layer 16 and Nitride 15 are etched, needs to be considered, the amount of over etching is very little. In the follow-up technical field, the amount of over etching can be ignored. The second step is etching the Metal Layer 16 by $Cl_2$ and $O_2$ to form the Expected Metal Gate 16'. The $SiN_x$ layer and the $SiO_x$ layer will not be etched in this step, so that the shape of $SiN_x$ and $SiO_x$ shown in the figure is formed. The disadvantages of the process is that as follows: The $SiO_x$ layer can not be etched sufficiently, which causes the ions not to pass through Oxide 14 and not to be implanted into Poly-silicon 13, and the threshold voltage Vth is not easy to adjust. The advantage factor is shown by the dotted line in FIG. 1C, the practical threshold voltage is smaller than the expected normal threshold voltage.

Chinese Patent No. CN101852893A discloses a method for performing deep etching on silicon dioxide by taking photo-resist as a mask. The method comprises the following steps of: 1, preparing a photo-resist mask on the surface of a silicon dioxide sample; 2, heating the photo-resist mask in a gradient mode to harden the mask; and 3, etching the silicon dioxide sample by an ICP dry method. The method for performing the deep etching on the silicon dioxide by taking the photo-resist as the mask has the advantages of simple and fast process, high selection ratio, capability of achieving an etching depth of 25 microns, good etching appearance, steep side wall and the like.

Chinese Patent No. CN1560657 uses a compound masking technology combining the metal film and photoetching glue layer, realizes the deep etching process to the silicon dioxide. The invention uses photoetching glue and it generates no attaching particles in reaction ion etching process, and the etching selection rate is high of Cr, Al, NI metal masking films when F contained plasma is used to etch the silicon dioxide. It solves the deficiencies that the etched surface is coarse, radio frequency polarization can not too high, and the speed is slow in mask film etching process with metal film, at the same time, it can avoid the negative caused by using the single photoetching glue. The other character of the invention is: the thickness of the demanded metal film and the photoetching glue is less than the thickness in only using one of then, it can reduce the difficulty of filming process and etching process and the cost, upgrades the photoetching yield and the minimal figure resolution, and it can be realized easily.

U.S. Patent No. 2007/0249182 A1 disclosed a method for etching the silicon dioxide. Wafers having a high K dielectric layer and an oxide or nitride containing layer are etched in an inductively coupled plasma processing chamber by applying a source power to generate an inductively coupled plasma, introducing into the chamber a gas including $BCl_3$, setting the temperature of the wafer to be between 100 DEG C. and 350 DEG C., and etching the wafer with a selectivity of high K dielectric to oxide or nitride greater than 10:1. Wafers having an oxide layer and a nitride layer are etched in a reactive ion etch processing chamber by applying a bias power to the wafer, introducing into the chamber a gas including $BCl_3$, setting the temperature of the wafer to be between 20 DEG C. and 200 DEG C., and etching the wafer with an oxide to nitride selectivity greater than 10:1. Wafers having an oxide layer and a nitride layer are etched in a an inductively coupled plasma processing chamber by applying a bias power to the wafer, applying a source power to generate an inductively coupled plasma, introducing into the chamber a gas including $BCl_3$, setting the temperature of the wafer to be between 20 DEG C. and 200 DEG C., and etching the wafer with an oxide to nitride selectivity greater than 10:1. Consequently, the above invention did not solve the problem that the practical threshold voltage is smaller than the expected normal threshold voltage.

SUMMARY OF THE INVENTION

An embodiment of the present disclosure is directed toward a method for adjusting the threshold voltage of LTPS TFT capable of compensating the problem that the SiOx layer can not be etched sufficiently, and the threshold voltage of TFT is not easy adjusted, and the practical threshold voltage is smaller than the expected normal threshold voltage.

The method for adjusting the threshold voltage of LTPS TFT, comprising: (a) forming a poly-silicon layer on a substrate; from bottom to top, depositing a first dielectric layer and a second dielectric layer on the poly-silicon layer in sequence; and then forming a metal layer on the second dielectric layer; (b) etching the metal layer and the second dielectric layer by a patterned photoresist coated on the metal layer to form a transition gate insulating film and a second gate insulating film respectively; (c) etching the edge portion of the respective two sides of the patterned photoresist and the transition gate to change the width of the patterned photoresist and the transition gate from a first width to a second width shorter than the first width in order to form a metal gate; wherein, the first dielectric layer is simultaneously etched to form a first gate insulating film which is between the local area of the poly-silicon layer and the second gate insulating film, and to form a reserve layer above the other area of the poly-silicon layer; (d) forming a low concentration doped region in the poly-silicon layer below the portion of the composite gate insulating film uncovered by the metal gate by utilizing the metal gate and a composite gate insulating film composed of the first gate insulating film and the second insulating film as the screen object in the doping process and by utilizing the self-aligned process; and forming a high concentration doped region in the poly-silicon layer below the reserve layer; wherein the low concentration doped region and the high concentration doped region constitute the source/drain with step doping concentration.

In (a), the step of forming the poly-silicon layer further comprises performing an annealing process to recrystallize the amorphous silicon layer formed on the substrate into the poly-silicon layer. In (a), further comprising a step of forming a buffer layer over the substrate before the poly-silicon layer is formed on the substrate; wherein the buffer layer comprises a silicon nitride layer and a silicon oxide layer from bottom to top, and then the poly-silicon layer is formed on the buffer layer. The first dielectric layer is silicon oxide, and the second dielectric layer is silicon nitride; the etching gas in the dry etching steps of (b) comprises $SF_6$ and $O_2$, and the etching gas in the dry etching steps of (c) comprises $Cl_2$ and $O_2$. The power of the dry etching process in (c) is 12 KW to 15 KW, the pressure of the dry etching process in (c) is 12 mtorr to 15 mtorr, and the temperature of the dry etching process (c) is 100° C. The thickness of the reserve layer is 1/10 to 1/2 of the initial thickness of the first dielectric layer. The transistor is N-type transistor; the implanted dopant in (d) comprises the group V elements. The first dielectric layer is formed by PECVD, which comprises the silicon oxide based on TEOS; the second dielectric layer is formed by PECVD, which comprises the silicon nitride. Thickness of the silicon oxide is 500 Å to 1200 Å; the thickness of the silicon nitride is 100 Å to 500 Å. In (c), a composite gate insulating film with the sloped sidewalls is formed; and after (d) is accomplished, the doping concentration of the low concentration doped region which is located below the sloped sidewalls of the composite gate insulating film decreases progressively in the direction that from the underface of the bottom edge of the sloped sidewalls to the underface of the top edge of the sloped sidewalls.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTION

Figure 1A:
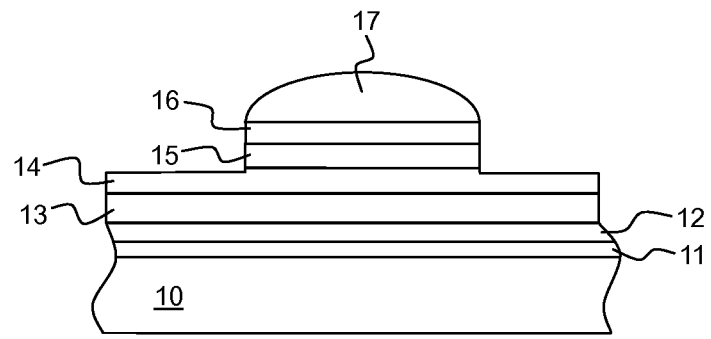
FIG. 1A-FIG. 1B shows the steps of etching the metal layer, the silicon nitride and the silicon oxide.
Figure 1B:
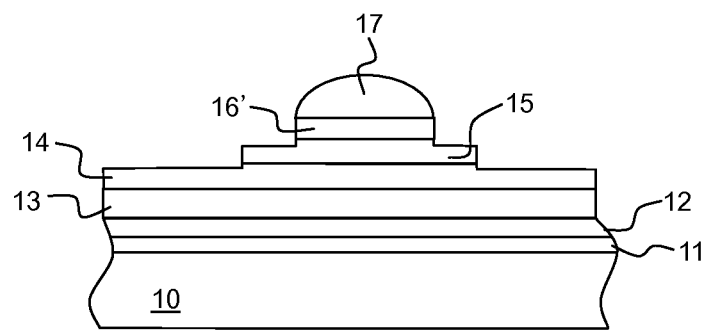

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximately estimated, meaning that the term "around", "about" or "approximately" can be inferred if not expressly stated.

As used herein, the term "plurality" means a number greater than one.

Figure 2A:
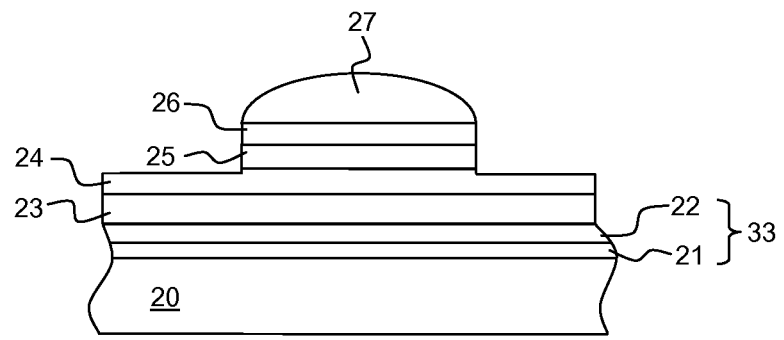
FIG. 2A-FIG. 2C shows the step processes of the embodiment in the present disclosure.

As shown in FIG. 2A, the LTPS productions, such as a LTPS device comprising an N-type TFT, comprise an insulating Substrate 20 (the glass substrate or the quartz substrate and so on) of about 0.3-0.7 mm in thickness. After being cleaned, Substrate 20 is covered by a Buffer Layer 33 comprising a $SiN_x$ Layer 21 of about 50-100 nm in thickness deposited by PECVD and a $SiO_x$ Layer 22 of about 100-150 nm in thickness. And then a Poly-silicon Layer 23 is formed above Buffer Layer 33. The influence on the Poly-silicon Layer 23 caused by the metal atoms in Substrate 20 can be inhibited by $SiN_x$ Layer 21. The potential negative influence in quality of Poly-silicon Layer 23 caused by the defect state of $SiN_x$ Layer 21 can be prevented by $SiO_x$ Layer 22. When the preparation of Buffer Layer 33 is accomplished, an annealing process can be performed to optimize the quality of the Buffer Layer 33. Generally, the initial state of Poly-silicon Layer 23 is formed by the following steps: Firstly, an amorphous silicon (α-Si) is formed by PECVD; and then after the processes such as the ELA process and the solid phase crystallization process are performed, the amorphous silicon is recrystallized into poly-silicon.

When the treatment performed to Poly-silicon Layer 23 is accomplished, the insulating layer formed on Poly-silicon Layer 23 can be a composite layer comprising a first dielectric layer and a second dielectric layer; as an example, the first dielectric layer is the $SiO_x$ Film 24 and the second dielectric layer is the $SiO_x$ Film which is on the first dielectric layer, and the thicknesses thereof are respectively 30 nm to 100 nm and 60 nm to 150 nm. Then, a metal layer of 25 nm to 400 nm in thickness is formed on the $SiN_x$ film by the sputtering process, and the material thereof can be the electrode material of Al, Mo, the composite Al/Mo or the composite Nd-Al and so on. And then a photoresist is coated over the metal layer therewith. Parts of the processes thereof are not given, since it is well known by the technical personnel of the technical field. The initial photoresist shown in FIG. 2A has already been treated by the exposure process and the developing process in the photoetch technique, so Patterned Photoresist 27 is acquired. Then Patterned Photoresist 27 is used as the mask to perform the dry etching process. The etching gas thereof comprises $SF_6$ and $O_2$. The initial metal layer is etched to form a Transition Gate 26 of the remaining metal. The $SiN_x$ film on $SiO_x$ 24 is simultaneously etched to form a Remaining Second Gate Insulating Film 25.

Figures 1, 2B:
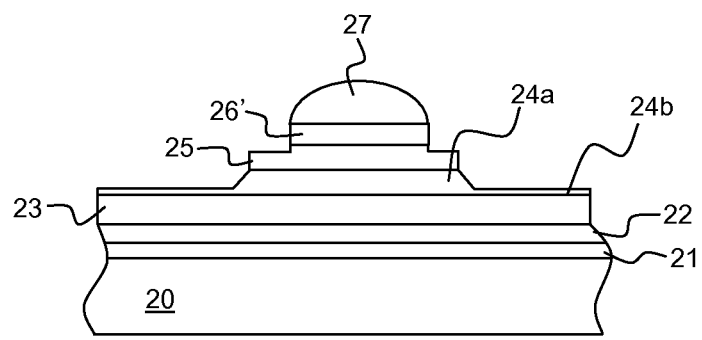
Figures 2, 2B:
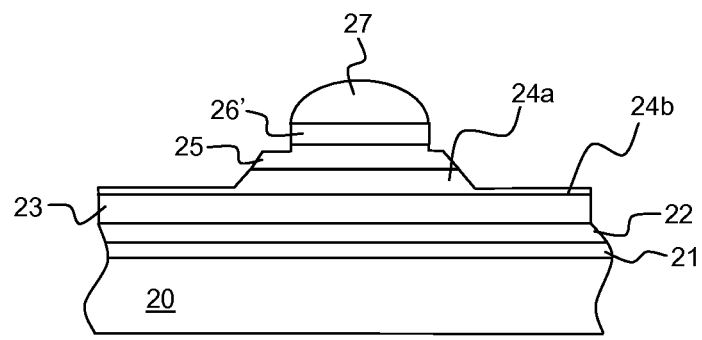

As shown in FIG. 2B-1, an over etching process of dry etching is performed. During the over etching process, the extent of the over etching process for $SiO_x$ 24 is enhanced compared with the prior process. For instance, the each parameter generally adopted in the prior G4.5 generation technology, such as the etching power of 10 KW, the pressure of 10 mtorr, and the temperature of 80° C., are increased by 10%-50%, so that the potency dimension of over etching is strengthened (i.e. in the embodiment of the present disclosure, the potency dimension of etching is 110%-150% of that in the prior art). However, what needs to be noticed is that in order to avoid the situation that the $SiO_x$ is etched through to damage Poly-silicon Layer 23, and the increased potency dimension of etching should not be too large. The improvement of the potency dimension of etching can be adjusted by the etching power, etching pressure, etching temperature and the time of etching. For example, the mixed gas used in the etching process comprises $Cl_2$ and $O_2$, and the etching power is 12 KW to 15 KW, and the pressure is 12 mtorr to 15 mtorr, and the temperature is 80° C. to 150° C. (such as 100° C.). When the Patterned Photoresist 27 is partially etched in thickness, the portion on the edge of the two sides of Patterned Photoresist 27 is etched, and the portion on the edge of the two sides of Transition Gate 26 is also etched, so that the width of Patterned Photoresist 27 is changed from a first width to a second width by etching, and the width of Transition Gate 26 is changed from a first width to a second width by etching, wherein the second width is smaller than the first width. A Metal Gate 26' is formed after Transition Gate 26 has been etched. During the etching process, the first dielectric layer (i.e. the $SiO_x$ film) is also etched. As the portion of $SiO_x$ 24 film between Poly-silicon Layer 23 and Second Gate Insulating Film 25 is affected by the shelter of Metal Gate 26' and Second Gate Insulating Film 25 in the etching process, a First Gate Insulating Film 24a located between Poly-silicon Layer 23 and Second Gate Insulating Film 25 is formed by etching $SiO_x$ 24. The first gate insulating film is located above a local area where Poly-silicon Layer 23 and Second Gate Insulating Film 25 are overlapped, and is located between the local area and Second Gate Insulating Film 25. Meanwhile, since the other portion of $SiO_x$ 24, not located between Poly-silicon 23 and Second Gate Insulating Film 25, is lack of the shelter effect for etching caused by Metal Gate 26' and Second Gate Insulating Film 25, a Reserve Layer 24b is formed above the portion of Poly-silicon Layer 23 except the beforementioned local area. In some selectable embodiments, the thickness of Reserve Layer 24b is ⅒ to ½ of the initial thickness of $SiO_x$ 24, it can be deemed as the ways of selecting and not deemed as the limitation of the present disclosure. In FIG. 2B-2, as the loss will be caused in the two sides of Second Gate Insulating Film 25 in the etching process, the portion of the two sides of First Gate Insulating Film 24a not covered by Second Insulating Film 25 is influenced by etching in the etching process, and First Gate Insulating Film 24a with the sloped sidewalls as shown in figures is formed. The vertical section of First Gate Insulating Film 24a is trapezoid. The width thereof increases gradually from top to bottom. Substantially, in the over etching process, the sidewalls of the two sides of Second Gate Insulating Film 25 also will be influenced by the over etching process to form Second Gate Insulating Film 25 with the sloped sidewalls as shown in FIG. 2B-2. Hence, the composite gate insulating film composed of the first gate insulating film and the second gate insulating film also has sloped sidewalls. The vertical section of the composite gate insulating film is trapezoid. The width thereof increases gradually from top to bottom.

As shown in Figure C, Metal Gate 26' and the composite gate insulating film composed of First Gate Insulating Film 24a and Second Gate Insulating Film 25 are used as the dopant in doping process, and with the self-aligned process, Poly-silicon Layer 23 is adopted by the atoms such as phosphorus. N-type TFT is mainly implanted by the element in Group V in the element periodic table. Low Concentration Doped Regions 23a-2 and 23b-2 are formed in Poly-silicon Layer 23 below the portion of the composite gate insulating film not covered by Metal Gate 26'. High Concentration Doped Regions 23a-1 and 23b-1 is formed in the portion of the poly-silicon layer below Reserve Layer 24b. Reserve Layer 24b is a screen layer in the doping process, however the thickness thereof is rather low in the over etching process. Hence, the dopant implanted into Poly-silicon Layer 23 will not be affected. Almost all the dopant can penetrate Reserve Layer 24b directly and access to Poly-silicon Layer 23 below to form Doped Region 23a-1 and 23b-1. Hence, Doped Region 23a-1 and 23b-1 below the Reserve Layer 24b both have the higher doping concentration. The portion of the composite gate insulating film not covered by Metal Gate 26' is thicker than Reserve Layer 24b. However, the composite gate insulating film still can let a part of the dopant pass through the portion thereof not covered by Metal Gate 26' and access to Poly-silicon layer 23 below for forming Doped Regions 23a-2 and 23b-2. The doping concentration of Doped Regions 23a-2 and 23b-2 is much lower than that of Doped Regions 23a-1 and 23b-1. In addition, the characteristic of the Metal Gate 26' is to shield the implanting of the dopant, therefore no dopant can pass through Gate Metal 26'. Hence, Channel Region 23c where Poly-silicon 23 and the Metal Gate 26' are overlap is not doped by dopant. The Ddoped Regions 23b-1 and 23b-2 neighboring together compose the drain/source of the transistor. Meanwhile, Doped Regions 23a-1 and 23a-2 neighboring together compose the source/drain of the transistor. In the ion implanting process, based on the formation of the composite gate insulating film with the sloped sidewalls, the doping concentration of the portion of Low Concentration Doped Regions 23a-2 and 23b-2 below the sloped sidewalls of the composite gate insulating film is stepped. For instance, the doping concentration of the portion of Doped Region 23a-2 between a region which is from the underface of Bottom Edge 50b of the sloped sidewalls to the underface of the top edge of the sloped sidewalls decreases gradually in a direction that from the underface of the Bottom Edge 50b of the sloped sidewalls to the under face of Top Edge 50a of the sloped. For Doped Region 23b-2, the doping concentration thereof is the same as that of Doped Region 23a-2. Since Reserve Layer 24b is affected by the implanting of dapant, it can be selectively etched. Then a dense silicon oxide is formed again over the exposed Poly-silicon Layer 20.

Figure 2C:
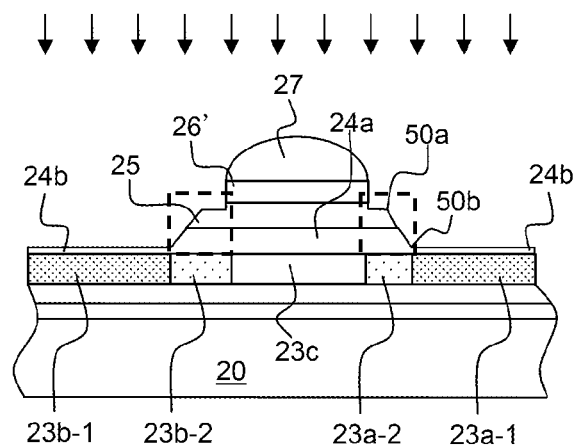
Figure 3:
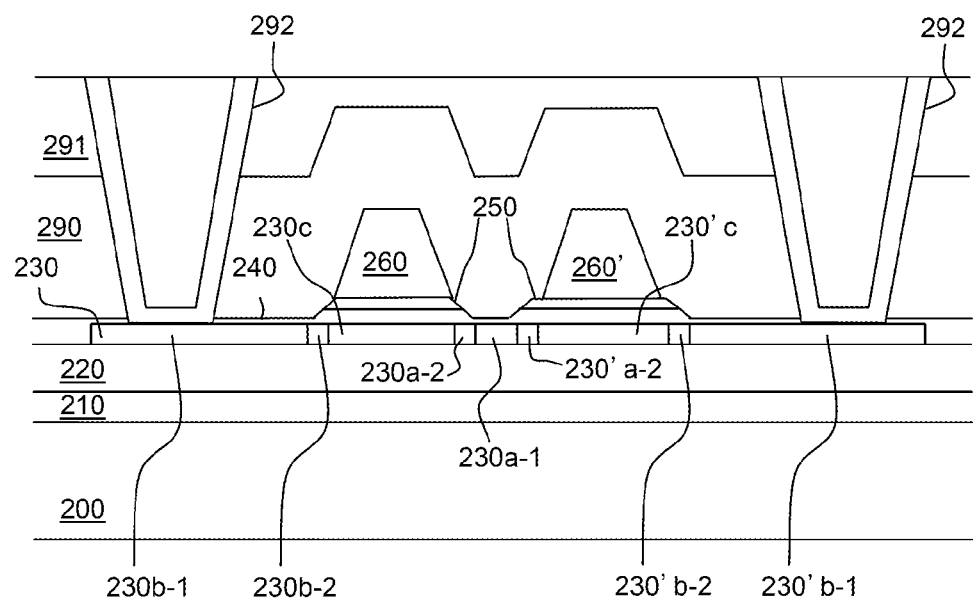
FIG. 3 shows the transistor formed by the steps of the embodiment in the present disclosure.

FIG. 3 shows an example of a device with two transistors manufactured according to FIG. 2a to FIG. 2c. A Silicon Nitride Layer 210 and a Silicon Oxide Layer 220, which are used as the buffer layer, are formed on Substrate 200. Poly-silicon Layer 230 is formed on Silicon Oxide Layer 220. First Gate Insulating Layer 240 covers Poly-silicon Layer 230.

Second Gate Insulating Layer 250 and Gate 260 and 260' are located above First Gate Insulating Layer 240. Heavily Doped Region 230b-1 and Lightly Doped Region 230b-2 formed in Poly-silicon Layer 230 compose the source/drain of a transistor (Gate 260), and Heavily Doped Region 230a-1 and Lightly Doped Regions 230a-2 and 230'a-2 also compose the drain/source of another transistor (Gate 260'). Heavily Doped Region 1230a-1, 230'b-1) and Lightly Doped Regions 230a-2 and 230'a-2; 230'b-2) formed in Poly-silicon Layer 230 compose the drain/source, the source/drain, and a Channel Region 230c between the drain/source of a transistor (Gate 260) and the other transistor (Gate 260'). Channel Region 230c, 230'c) forms a channel of current and is controlled by Gate (260, 260'). Wherein, Lightly Doped Region (230a-2, 230'a-2) and (230b-2, 230'b-2) are overlapped with the First Gate Insulating Layer 240 and the potion of Second Gate Insulating Layer 250 below Gate (260, 260') and not covered by Gate (260, 260'). Interlevel Dielectric Layer 290 covers the upper surface of Gate 260 and 260' and First Gate Insulating Layer 240. Insulating Film 291 covers the upper surface of Interlevel Dielectric Layer 290. Contact Holes 292 filled with the conductive material inside, which is used as the interconnecting structure, are formed in Interlevel Dielectric Layer 290 and Insulating Layer 291, which aligns and contacts Heavily Doped Region 230b-1 and 230'b-1. The poly-silicon transistor as shown in FIG. 3 can acquire a preferable threshold voltage Vth.

Figure 1C:
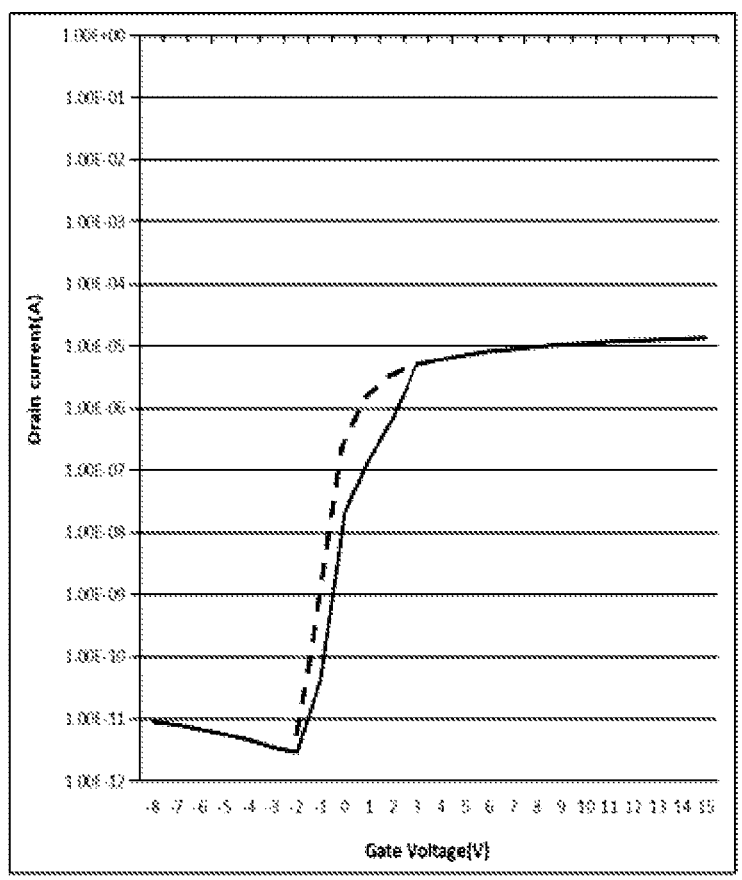
FIG. 1C shows the schematic diagram of the way based on FIG. 1A-FIG. 1B to offset the threshold voltage.

As shown in FIG. 1C, in the prior art, the etching power is 10 KW, the etching pressure is 10 mtorr, the etching temperature is 80° C., and the threshold voltage is formed as shown by the dotted line. However, in the new process, the potency dimension of over etching is improved by 10% to 50%, and the physical bump of the ions is improved. Hence, a portion of the $SiO_x$ layer can be etched, and the stepped distribution of the N+/N− ions implanted into the $SiO_x$ layer is much more obviously, as shown in FIG. 2A to FIG. 2C. As shown by the solid line in FIG. 1C, the threshold voltage (Vth) of the LTPS productions in the prior art is shown by the left dotted line in the figure, and the threshold voltage (Vth) of the LTPS productions manufactured by the new process is shown by the right solid line in the figure. The threshold voltage of the N-type device is symmetric with the threshold voltage of the P-type device, thereby Vth is adjusted, and the stability of current is increased.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method for adjusting low temperature poly-silicon thin film transistor (LTPS TFT) threshold voltage, the method comprising the steps of:
    (a) forming a poly-silicon layer on a substrate; from bottom to top, depositing a first dielectric layer and a second dielectric layer on the poly-silicon layer in sequence; and then forming a metal layer on the second dielectric layer;
    (b) etching the metal layer and the second dielectric layer with a patterned photoresist coated on the metal layer to form a transition gate and a second gate insulating film respectively;
    (c) etching an edge portion of two opposing sides of the patterned photoresist and the transition gate to change a width of the patterned photoresist and the transition gate from a first width to a second width shorter than the first width in order to form a metal gate;
    wherein, the first dielectric layer is simultaneously etched in step (c) to form a first gate insulating film which is between a local area of the poly-silicon layer and the second gate insulating film, and to form a reserve layer above other areas of the poly-silicon layer; and
    (d) forming a low concentration doped region in the poly-silicon layer below a portion of a composite gate insulating film composed of the first gate insulating film and the second gate insulating film not covered by the metal gate by utilizing the metal gate and the composite gate insulating film a mask in a doping process and by utilizing a self-aligned process; and forming a high concentration doped region in the poly-silicon layer below the reserve layer; wherein the low concentration doped region and the high concentration doped region constitute a source and a drain having a stepped doping concentration.

2. The method as disclosed in claim 1, wherein in (a), the step of forming the poly-silicon layer further comprises performing an annealing process to recrystallize an amorphous silicon layer formed on the substrate into the poly-silicon layer.

3. The method as disclosed in claim 1, wherein in (a), further comprising a step of forming a buffer layer on the substrate before the poly-silicon layer is formed on the substrate;
    wherein, the buffer layer comprises a silicon nitride layer and a silicon oxide layer from bottom to top, and the poly-silicon layer is formed on the buffer layer.

4. The method as disclosed in claim 1, wherein the first dielectric layer is silicon oxide and the second dielectric layer is silicon nitride.

5. The method as disclosed in claim 1, wherein an etching gas in the etching step of (b) comprises $SF_6$ and $O_2$ and an etching gas in the etching step of (c) comprises $Cl_2$ and $O_2$.

6. The method as disclosed in claim 5, wherein a power of the etching step in (c) is 12 KW to 15 KW, a pressure of the etching step in (c) is 12 mtorr to 15 mtorr, and a temperature of the etching step in (c) is 100° C.

7. The method as disclosed in claim 1, wherein a thickness of the reserve layer is 1/10 to 1/2 of an initial thickness of the first dielectric layer.

8. The method as disclosed in claim 1, wherein an N-type transistor is formed; and an implanted dopant in (d) comprises group V elements.

9. The method as disclosed in claim 1, wherein the first dielectric layer is formed by plasma enhanced chemical vapor deposition (PECVD), which comprises a tetraethyl orthosilicate (TEOS) based silicon oxide; and the second dielectric layer is formed by PECVD, which comprises a silicon nitride.

10. The method as disclosed in claim 9, wherein a thickness of the silicon oxide is 500 Å to 1200 Å; and a thickness of the silicon nitride is 100 Å to 500 Å.

11. The method as disclosed in claim 1, wherein in (c), the composite gate insulating film with sloped sidewalls is formed; and after (d) is accomplished, a doping concentration of the low concentration doped region which is located below the sloped sidewalls of the composite gate insulating film decreases progressively in a direction from an underface of a bottom edge of the sloped sidewalls to an underface of a top edge of the sloped sidewalls.

* * * * *